AUTOMATIC RESONANCE-TUNING MEANS WHICH HUNTS WHEN FAR OFF TUNE

Filed May 5, 1955

Inventors: Clifford Edward Tate + Hugh McFadyen Boyle
By their attorneys: Baldwin + Wight United States Patent Office 2,798,150

Patented July 2, 1957

2,798,150

AUTOMATIC RESONANCE-TUNING MEANS WHICH HUNTS WHEN FAR OFF TUNE

Clifford Edward Tate, Chelmsford, and Hugh McFadyen Boyle, Great Baddow, England, assignors to Marconi's Wireless Telegraph Company Limited, London, England, a British company Application May 5, 1955, Serial No. 506,324

Claims priority, application Great Britain May 14, 1954

7 Claims. (Cl. 250—17)

Figures 1, 2, 3:
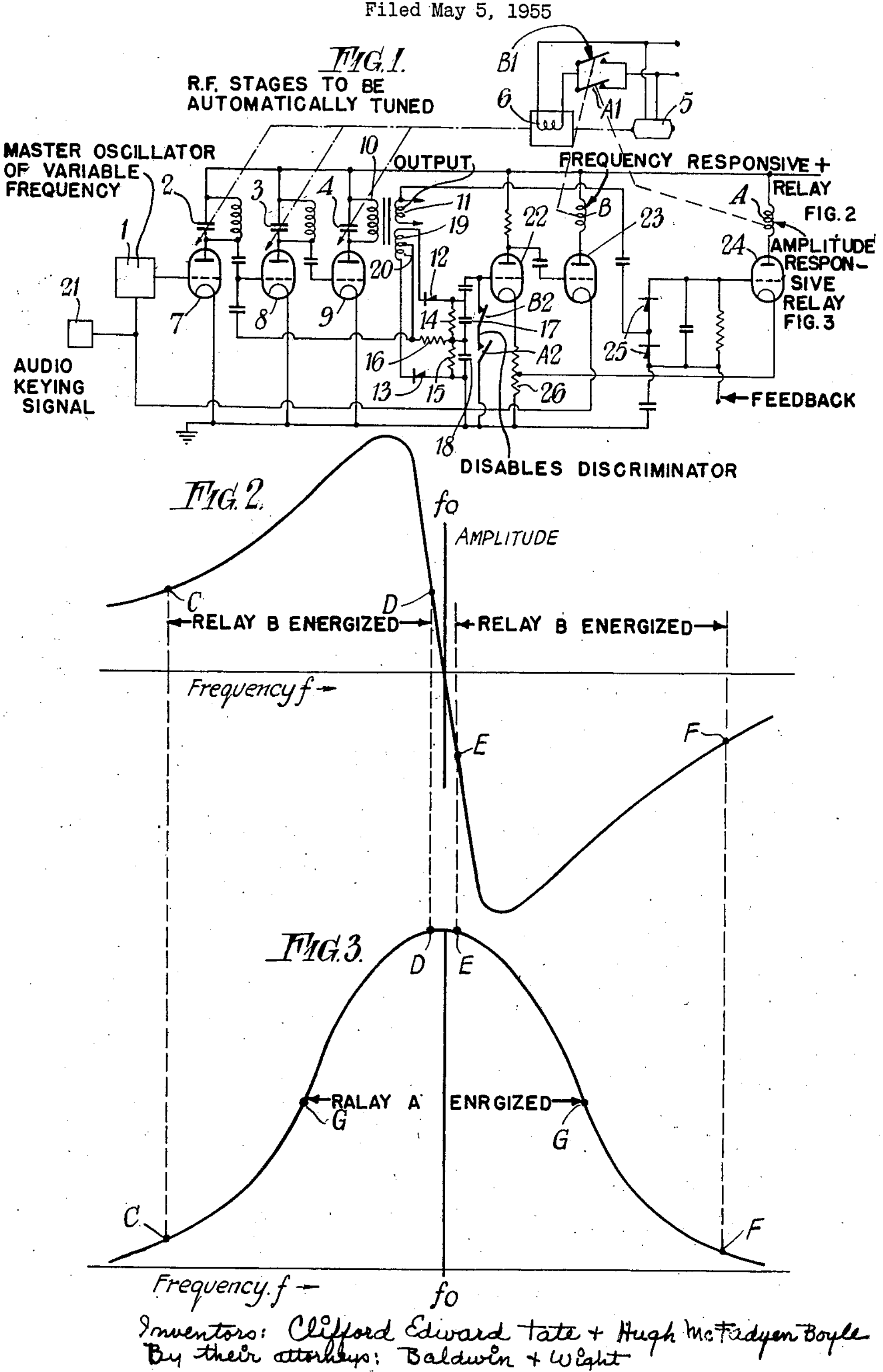

This invention relates to automatic tuning control arrangements and more specifically to such arrangements of the kind in which at least one variably tunable circuit has its tuning element driven by a motor until it becomes tuned to a pre-determined frequency equal to that of a desired signal fed thereto, whereupon the motor drive is automatically brought to rest.

In automatic tuning control arrangements of the kind referred to it is customary to employ a discriminator to control the motor. In general, however, known tuning control arrangements of this kind have the defect, which arises from the fact that the effective operating range of the discriminators of good sensitivity is comparatively limited, that the same control result which is obtained in the position of correct tuning is also obtained in positions of incorrect tuning far removed from the correct position and on either side thereof. This results in ambiguity and uncertainty of operation, for the effect on the motor control is the same whether the controlled circuit is correctly tuned or very badly mistuned. The principal object of this invention is to avoid this defect while still using a discriminator of good sensitivity but limited effective operating range.

According to the present invention there is provided an automatic tuning control arrangement of the kind referred to, comprising in combination, at least one variably tunable circuit to be controlled, the tunable circuit including the tuning element, and the motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," and means responsive both to the output of the discriminator and to the signal amplitude produced in the circuit to be controlled, for causing the motor drive to cease only when the predetermined output signal conditions occur simultaneously with the presence in the controlled circuit, of an amplitude exceeding a predetermined minimum. Thus the motor drive ceases only when the correct tuning position is reached for, in a badly "off tune" position, although the discriminator gives the same output (normally zero) as in the correct tuning position, there will be substantially zero amplitude in the controlled circuit.

Preferably means are provided for co-relating the effective operating gain of the discriminator with the signal amplitude produced in the circuit to be controlled.

Preferably the discriminator is a phase discriminator fed with a radio frequency chopped or modulated at an audio frequency and either the output from said discriminator is utilized for control via a phase detector valve which is gated by said audio frequency or means are provided for automatically disabling the discriminator control once the motor drive has been caused to cease.

For a better understanding of the invention and to show how the same may be carried into effect reference will now be made to the acompanying drawing in which:

Fig. 1 is a circuit diagram of a preferred embodiment as applied to an automatically tuned radio transmitter; and Figs. 2 and 3 are explanatory graphical figures.

Although the invention is illustrated as applied to a radio transmitter it is, of course, of broad application to any arrangement wherein automatic tuning is required, e. g. to a radio receiver or to a transmitter-receiver.

Referring to Fig. 1 the apparatus therein represented includes a source of radio frequency 1, for example a crystal controlled oscillator, and gang tuned radio frequency circuits 2, 3, 4 which are the circuits to be controlled and which have tuning elements, represented as variable condensers, which latter are driven through a magnetic clutch 6 by an electric motor 5 which runs continuously while tuning is in progress. When the clutch is open the mechanical drive is, of course, broken. The circuit to the operating coil of the clutch includes a normally closed relay contact A1 and a normally open relay contact B1 in parallel so that if either, or both of these contacts is, or are, closed the clutch circuit is completed and the clutch is closed. The mechanical drive is represented by chain dotted lines. The controlled circuits are shown as the anode tuned circuits of amplifier valves 7, 8, 9 in cascade, the first valve 7 being fed from the oscillator 1 and the last valve 9 feeding through the windings 10, 11 of a transformer to subsequent utilization circuits with which the invention is not concerned and which are therefore not shown.

Output from the anode of the valve 7 is tapped off to a phase discriminator comprising rectifiers 12, 13, resistances 14, 15, 16, condensers 17, 18 and the halves 19, 20 of a further winding on the transformer. When the circuits 3 and 4 are exactly in resonance with the frequency from the source 1 the voltages at the two ends of the winding constituted by the halves 19, 20 will be in phase opposition and both in quadrature with the voltage from the anode of valve 7, the phase opposed voltages being of equal amplitude. When the tuning is incorrect the quadrature relation is lost. The discriminator itself is thus purely a phase discriminator without frequency discrimination. It will be observed that it contains no tuned circuits and is effectively aperiodic. In the arrangement illustrated the output from the oscillator 1 is "chopped" or modulated at audio frequency supplied from a source 21 and accordingly the output from the discriminator, which is of form well known per se, will be of the same audio frequency and of a phase dependent upon whether the tuning of the circuits 3 and 4 is below, or above, the radio frequency supplied by source 1 to valve 7.

The audio frequency output from the discriminator is amplified by an A. C. amplifier 22 and fed to the control grid of a valve 23, the anode circuit of which includes the coil B of a relay operating the contact B1 already mentioned, and an additional normally closed contact B2 in the grid circuit of valve 22. In series with the contact B2 is the normally open contact A2 of the same relay which has the contact A1, the coil of this relay being shown at A. It will be seen that if both contacts A2, B2 are closed the control grid of valve 22 is earthed and the discriminator is in effect disabled for its output is not passed on to valve 23. If either A2 or B2 is open, the valve 22 acts as a normal amplifier.

The crystal controlled oscillator 1 includes a plurality of crystal controls for the oscillator, together with a selective switch whereby the proper crystal can be selected for controlling the frequency of the generated oscillations. The modulation effected by the chopper in source 21 does not effect the transmitter during the process of tuning because the transmitter proper is disconnected from the aerial during the tuning process. Consequently, no modulation from source 21 can reach the air. The arrangement is such that by suitably connected relays as soon as the desired frequency is properly tuned in, the transmitter is connected to the aerial, but then as the modulation effected by chopper 21 has performed its function, this also is disconnected automatically and, therefore, also will not be transmitted as a modulation of the wave.

The audio frequency from source 21 is also applied in phase as a gating wave form to the cathode of the valve 23 which therefore acts as a phase sensitive rectifier. The relation between discriminator output and frequency $f$ is represented conventionally in Fig. 2 and it will be seen that said output falls to zero at the frequency $f_0$ at which the circuits 3 and 4 are resonant to the radio frequency from oscillator 1 and falls away again outwardly off two peaks of maximum output. The phase changes through 180° in passing through the abscissa line at $f_0$. The relay whose coil is shown at B will therefore release at and near $f_0$ on Fig. 2 (say between the points D and E) and will also release at frequencies outwardly of the points (C and F) whose ordinate values are the same as those of the points D and E respectively. In either case contacts B1 will close and contacts B2 will open, it being presumed that relay coil B releases for outputs less than that at C, D, E or F, i. e. outwardly of C and F or between D and E.

Radio frequency output is also taken from one end of winding 11 to a rectifying amplitude sensitive circuit including a valve 24 in whose grid circuit is a network including rectifiers 25, and whose anode circuit includes the winding A of the relay having contacts A1, A2. Fig. 3 is a characteristic curve drawn to the same frequency scale as Fig. 2 and connecting radio frequency output power at coil 11 with frequency $f$. The relay coil A is arranged to respond, to open contacts A1 and close contacts A2, for powers exceeding that at points nearer $f_0$ than points C and F (which are repeated, as also are points D and E, in Fig. 3) e. g. at points G.

Suppose the controlled circuits are well off tune so that both relays are de-energized. Then the clutch coil is energized through contacts A1 and the clutch is closed so that the motor alters the tuning. Contact B1 is open, contact B2 closed and contact A2 is open. As tuning proceeds point C (Fig. 2) is reached, coil B energizes, contact B1 closes and contact B2 opens. A little later point G (Fig. 3) is reached and contact A1 now opens and contact A2 closes. The clutch, however, remains closed through B1 and the valve 22 is still operative since B2 is now open. When point D is reached, however, coil B releases again, opening B1 and (since A1 is now open) opening the clutch and causing the motor drive to cease. At the same time contact B2 closes and, since A2 is now closed, the grid of valve 22 is earthed. However steep the curve of Fig. 2 may be between points D and E, therefore, there is (assuming, of course, there is enough time for relay release) no risk that the motor may "shoot through" the correct tuning position and the clutch reclose at point E because, once the grid of valve 22 is earthed, there is no output from the discriminator to valve 23, and once point D is passed the coil B cannot re-energize. This refinement reduces liability of the motor as a result of inertia and so on, to run the tuning through from point D to point E and thereafter to continue with a clutch which has been closed due to re-energization of coil B at point E.

It will be noted that the cathode circuit of the valve 24 operating coil A is returned to a point on the cathode leg resistance 26 of the amplifier valve 22 preceding the phase detector valve 23 so that a portion of resistance 26 constitutes a bias resistance common to both valves 22 and 24. The effect of this feedback provision is to co-relate the sensitivity of the discriminator controlled portion of the apparatus with the power present in the coil 11. By suitably selecting the circuit constants the feedback may be made such, and the different effective sensitivities of the discriminator at different values of power in the coil 11 may be made such, as to secure a desired overlap between the times of operation of relay coils A and B, i. e. a desired frequency spacing between the operating points C and G (Fig. 3) and at the same time a desired steepness of slope of the curve of Fig. 2 between the points D and E. Without this co-relation produced by feedback any increase in the overlap by increase in discriminator sensitivity is necessarily accompanied by an increase in steepness between points D and E and this, in many cases, may not be desired. The feedback may be obtained in any other way known per se and may be made positive or negative in dependence upon design requirements (positive feedback may be required in some cases to reduce liability to tune on spurious signals) negative feedback being, of course, obtained in the particular circuit chosen for illustration in Fig. 1.

In the arrangement illustrated, although the phase discriminator is fed with radio frequency chopped or modulated with audio frequency and the discriminator output is utilized for control via a phase detector valve which is gated at said audio frequency, provision is made for automatically disabling the discriminator control once the motor drive has ceased. Obviously, with this gated detector valve type of control, the latter provision is unnecessary (and vice versa) but both are shown in the one circuit for convenience of explanation and simplicity of drawing.

While we have described our invention in one of its preferred embodiments, we realize that modifications may be made, and we desire that it be understood that no limitations upon our invention are intended other than may be imposed by the scope of the appended claims.

We claim:

1. An automatic tuning control arrangement of the kind referred to, comprising, in combination, at least one variably tunable circuit to be controlled, the tunable circuit including the tuning element, and a motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," means for deriving a control voltage from the signal amplitude produced in the controlled circuit, and means responsive both to the output of the discriminator and to said derived control voltage for causing the motor drive to cease only when the predetermined output signal conditions occur simultaneously with the presence in the controlled circuit, of an amplitude exceeding a predetermined minimum, and, wherein the discriminator is a phase discriminator, and wherein the predetermined signal is fed to a first input of the discriminator at radio frequency, a phase detector valve circuit, an audio frequency source connected with said phase detector valve circuit, said valve circuit being connected to respond to the signal modulated and gated by the audio frequency.

2. An automatic tuning control arrangement of the kind referred to, comprising, in combination, at least one variably tunable circuit to be controlled, the tunable circuit including the tuning element, and a motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," means for deriving a control voltage from the signal amplitude produced in the controlled circuit, and means responsive both to the output of the discriminator and to said derived control voltage for causing the motor drive to cease only when the predetermined output signal conditions occur simultaneously with the presence in the controlled circuit, of an amplitude exceeding a predetermined minimum, a phase detector valve circuit gated at an audio frequency, and, wherein the means responsive both to the output of the discriminator and to the signal amplitude produced in the circuit to be controlled includes a first control means, connected to receive, as input, the output from the discriminator, means for controlling the motor drive to the element, a connection between the first control means and a first part of the means for controlling the motor drive, the arrangement being such that when the discriminator output attains a predetermined value, the first control means is caused to operate, and includes a second control means connected to receive, as input, the signal amplitude produced in the circuit to be controlled, means for feeding output from the second control means to a second part of the means for controlling the motor drive, the arrangement being such that when said signal amplitude attains a predetermined value said second control means is caused to operate, said discriminator being a phase discriminator, wherein a first input of the discriminator is arranged to be fed with a radio frequency input, which radio frequency is chopped or modulated at an audio frequency, the first control means including a first valve, the latter being gated at said audio frequency, and wherein a control grid of said valve is connected to receive the discriminator output, the output of the valve being connected to the first part of the means for controlling the motor drive.

3. An automatic tuning control arrangement of the kind referred to, comprising, in combination, at least one variably tunable circuit to be controlled, the tunable circuit including the tuning element, and a motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," means for deriving a control voltage from the signal amplitude produced in the controlled circuit, and means responsive both to the output of the discriminator and to said derived control voltage for causing the motor drive to cease only when the predetermined output signal conditions occur simultaneously with the presence in the controlled circuit, of an amplitude exceeding a predetermined minimum, a phase detector valve circuit gated at an audio frequency and wherein the means responsive both to the output of the discriminator and to the signal amplitude produced in the circuit to be controlled includes a first control means, connected to receive, as input, the output from the discriminator, means for controlling the motor drive to the element, a connection between the first control means and a first part of the means for controlling the motor drive, the arrangement being such that when the discriminator output attains a predetermined value, the first control means is caused to operate, and includes a second control means connected to receive, as input, the signal amplitude produced in the circuit to be controlled, means for feeding output from the second control means to a second part of the means for controlling the motor drive, the arrangement being such that when said signal amplitude attains a predetermined value said second control means is caused to operate, wherein the second control means includes a second valve connected to receive at a control grid thereof said signal amplitude, wherein the output of the valve is connected to said second part of the means for controlling the motor drive, and, wherein the first valve has a first relay winding in its anode circuit, this relay controlling a first pair of contacts, the second valve having a second relay winding in its anode circuit and controlling a second pair of contacts, these windings and contacts constituting the first and second parts of the means for controlling the motor drive, the pairs of contacts being connected in parallel in a control circuit that controls the drive to said element.

4. An automatic tuning control arrangement of the kind referred to, comprising, in combination, at least one variably tunable circuit to be controlled, the tunable circuit including the tuning element, and a motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," means for deriving a control voltage from the signal amplitude produced in the controlled circuit, and means responsive both to the output of the discriminator and to said derived control voltage for causing the motor drive to cease only when the predetermined output signal conditions occur simultaneously with the presence in the controlled circuit, of an amplitude exceeding a predetermined minimum, a phase detector valve circuit gated at an audio frequency and wherein the means responsive both to the output of the discriminator and to the signal amplitude produced in the circuit to be controlled includes a first control means, connected to receive, as input, the output from the discriminator, means for controlling the motor drive to the element, a connection between the first control means and a first part of the means for controlling the motor drive, the arrangement being such that when the discriminator output attains a predetermined value, the first control means is caused to operate, and includes a second control means connected to receive, as input, the signal amplitude produced in the circuit to be controlled, means for feeding output from the second control means to a second part of the means for controlling the motor drive, the arrangement being such that when said signal amplitude attains a predetermined value said second control means is caused to operate, wherein the second control means includes a second valve connected to receive at a control grid thereof said signal amplitude, wherein the output of the valve is connected to said second part of the means for controlling the motor drive, wherein the first valve has a first relay winding in its anode circuit, this relay controlling a first pair of contacts, the second valve having a second relay winding in its anode circuit and controlling a second pair of contacts, these windings and contacts constituting the first and second parts of the means for controlling the motor drive, the pairs of contacts being connected in parallel in a control circuit that controls the drive to said element, and, wherein the motor is arranged to run continuously, there being a clutch in the drive between the motor and said element, the clutch being operated by said control circuit.

5. An automatic tuning control arrangement of the kind referred to, comprising, in combination, at least one variably tunable circuit to be controlled, the tunable circuit including the tuning element, and a motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," means for deriving a control voltage from the signal amplitude produced in the controlled circuit, and means responsive both to the output of the discriminator and to said derived control voltage for causing the motor drive to cease only when the predetermined output signal conditions occur simultaneously with the presence in the controlled circuit, of an amplitude exceeding a predetermined minimum, a phase detector valve circuit gated at an audio frequency, and wherein the means responsive both to the output of the discriminator and to the signal amplitude produced in the circuit to be controlled includes a first control means, connected to receive, as input, the output from the discriminator, means for controlling the motor drive to the element, a connection between the first control means and a first part of the means for controlling the motor drive, the arrangement being such that when the discriminator output attains a predetermined value, the first control means is caused to operate, and includes a second control means connected to receive, as input, the signal amplitude produced in the circuit to be controlled, means for feeding output from the second control means to a second part of the means for controlling the motor drive, the arrangement being such that when said signal amplitude attains a predetermined value said second control means is caused to operate, wherein the second control means includes a second valve connected to receive at a control grid thereof said signal amplitude, wherein the output of the valve is connected to said second part of the means for controlling the motor drive, wherein the first valve has a first relay winding in its anode circuit, this relay controlling a first pair of contacts, the second valve having a second relay winding in its anode circuit and controlling a second pair of contacts, these windings and contacts constituting the first and second parts of the means for controlling the motor drive, the pairs of contacts being connected in parallel in a control circuit that controls the drive to said element, and, wherein the first winding controls a third pair of contacts and the second winding controls a fourth pair of contacts, the third and fourth pairs of contacts being connected in series in a by-pass circuit that is arranged effectively to disconnect the discriminator output and the grid of the first valve.

6. An automatic tuning control arrangement of the kind referred to, comprising, in combination, at least one variably tunable circuit to be controlled, the tunable circuit including the tuning element, and a motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," means for deriving a control voltage from the signal amplitude produced in the controlled circuit, and means responsive both to the output of the discriminator and to said derived control voltage for causing the motor drive to cease only when the predetermined output signal conditions occur simultaneously with the presence in the controlled circuit, of an amplitude exceeding a predetermined minimum, a phase detector valve circuit gated at an audio frequency and wherein the means responsive both to the output of the discriminator and to the signal amplitude produced in the circuit to be controlled includes a first control means, connected to receive, as input, the output from the discriminator, means for controlling the motor drive to the element, a connection between the first control means and a first part of the means for controlling the motor drive, the arrangement being such that when the discriminator output attains a predetermined value, the first control means is caused to operate, and includes a second control means connected to receive, as input, the signal amplitude produced in the circuit to be controlled, means for feeding output from the second control means to a second part of the means for controlling the motor drive, the arrangement being such that when said signal amplitude attains a predetermined value said second control means is caused to operate, wherein the second control means includes a second valve connected to receive at a control grid thereof said signal amplitude, wherein the output of the valve is connected to said second part of the means for controlling the motor drive, wherein the first valve has a first relay winding in its anode circuit, this relay controlling a first pair of contacts, the second valve having a second relay winding in its anode circuit and controlling a second pair of contacts, these windings and contacts constituting the first and second parts of the means for controlling the motor drive, the pairs of contacts being connected in parallel in a control circuit that controls the drive to said element, wherein the first winding controls a third pair of contacts and the second winding controls a fourth pair of contacts, the third and fourth pairs of contacts being connected in series in a by-pass circuit that is arranged effectively to disconnect the discriminator output and the grid of the first valve, and, wherein the discriminator output is connected to the grid of an amplifier valve that precedes the first valve, the by-pass circuit being connected between the last mentioned grid and earth.

7. An automatic tuning control arrangement of the kind referred to, comprising, in combination, at least one variably tunable circuit to be controlled, the tunable circuit including the tuning element, and a motor driving the element, a sensitive discriminator of limited effective operating range, the discriminator being arranged to produce a predetermined output signal condition when the controlled circuit is in resonance with a predetermined signal fed thereto, and producing the same signal condition when said controlled circuit is badly "off-tune," means for deriving a control voltage from the signal amplitude produced in the controlled circuit, and means responsive both to the output of the discriminator and to said derived control voltage for causing the motor drive to cease only when the predetermined output signal conditions occur simultaneously with the presence in the controlled circuit, of an amplitude exceeding a predetermined minimum, a phase detector valve circuit gated at an audio frequency and wherein the means responsive both to the output of the discriminator and to the signal amplitude produced in the circuit to be controlled includes a first control means, connected to receive, as input, the output from the discriminator, means for controlling the motor drive to the element, a connection between the first control means and a first part of the means for controlling the motor drive, the arrangement being such that when the discriminator output attains a predetermined value, the first control means is caused to operate, and includes a second control means connected to receive, as input, the signal amplitude produced in the circuit to be controlled, means for feeding output from the second control means to a second part of the means for controlling the motor drive, the arrangement being such that when said signal amplitude attains a predetermined value said second control means is caused to operate, wherein a first input of the discriminator is arranged to be fed with a radio frequency input, which radio frequency is chopped or modulated at an audio frequency, the first control means including a first valve, the latter being gated at said audio frequency, wherein a control grid of said valve is connected to receive the discriminator output, the output of the valve being connected to the first part of the means for controlling the motor drive, wherein means are provided for correlating the effective operating gain of the discriminator with the signal amplitude produced in the circuit to be controlled, and, wherein the means for correlating includes a feedback path between second valve and the input side of the first valve.

(References on following page)

References Cited in the file of this patent

UNITED STATES PATENTS 2,369,542 Dietrich ---------------- Feb. 13, 1945
2,375,133 Polkinghorn ------------ May 1, 1945
2,472,957 Nicholson --------------- June 14, 1949
2,525,442 Bischoff ---------------- Oct. 10, 1950

FOREIGN PATENTS 907,665 Germany ------------------ July 8, 1949
518,480 Great Britain ------------ Feb. 28, 1940